(12) United States Patent
Yamada

(10) Patent No.: US 11,574,479 B2
(45) Date of Patent: Feb. 7, 2023

(54) IMAGE PROCESSING APPARATUS

(71) Applicants: KABUSHIKI KAISHA TOSHIBA, Tokyo (JP); Toshiba Electronic Devices & Storage Corporation, Tokyo (JP)

(72) Inventor: Yutaka Yamada, Fuchu Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 735 days.

(21) Appl. No.: 16/537,983

(22) Filed: Aug. 12, 2019

(65) Prior Publication Data

US 2020/0285860 A1 Sep. 10, 2020

(30) Foreign Application Priority Data

Mar. 8, 2019 (JP) .............................. JP2019-042304

(51) Int. Cl.
*G06V 20/56* (2022.01)
*G06F 11/10* (2006.01)
*G11C 29/36* (2006.01)
*G06V 20/68* (2022.01)

(52) U.S. Cl.
CPC .......... *G06V 20/56* (2022.01); *G06F 11/1004* (2013.01); *G06F 11/1044* (2013.01); *G11C 29/36* (2013.01); *G11C 2029/3602* (2013.01)

(58) Field of Classification Search
None
See application file for complete search history.

(56) References Cited

U.S. PATENT DOCUMENTS

| 5,850,261 | A | * | 12/1998 | Kondo | ................... | H04N 19/98 |
| | | | | | | 375/E7.231 |
| 5,994,916 | A | * | 11/1999 | Hayashi | ................ | G02F 1/1309 |
| | | | | | | 324/760.02 |
| 6,343,161 | B2 | * | 1/2002 | Uchida | .............. | H04N 1/00045 |
| | | | | | | 714/6.32 |
| 7,061,522 | B1 | * | 6/2006 | Kojima | ................ | G02B 6/2555 |
| | | | | | | 348/93 |
| 9,736,507 | B2 | | 8/2017 | Oh | | |
| 9,952,568 | B2 | | 4/2018 | Livadaras | | |

(Continued)

FOREIGN PATENT DOCUMENTS

JP 2018-191248 A 11/2018
JP 2018-532294 A 11/2018

*Primary Examiner* — Cynthia Britt
*Assistant Examiner* — Dipakkumar B Gandhi
(74) *Attorney, Agent, or Firm* — Foley & Lardner LLP

(57) ABSTRACT

An image processing apparatus including a plurality of transfer units, a data storage, an image processing processor, and a test circuit. A plurality of captured image data are respectively assigned to the plurality of transfer units and the plurality of transfer units transfer the assigned image data. The data storage unit stores the plurality of image data which are transferred by the plurality of transfer units. The image processing processor performs image processing on the plurality of image data which are stored in the data storage unit. The test circuit tests the image processing processor in a period during which the image data are not input from the data storage unit to the image processing processor.

13 Claims, 8 Drawing Sheets

(56) References Cited

U.S. PATENT DOCUMENTS

| | | | |
|---|---|---|---|
| 2002/0120194 A1* | 8/2002 | Satoh | G01S 15/8993 |
| | | | 600/443 |
| 2011/0317027 A1* | 12/2011 | Shinmei | H04N 9/735 |
| | | | 348/E5.037 |
| 2012/0013626 A1* | 1/2012 | Lin | G06F 11/277 |
| | | | 345/522 |
| 2015/0281476 A1* | 10/2015 | Watanabe | H04N 1/387 |
| | | | 348/207.1 |
| 2016/0261373 A1* | 9/2016 | Nagasaka | H04J 3/1652 |
| 2017/0094268 A1* | 3/2017 | Gulati | G09G 3/006 |
| 2019/0007709 A1 | 1/2019 | Oh | |

* cited by examiner

IMAGE PROCESSING APPARATUS

CROSS-REFERENCE TO RELATED APPLICATION

This application is based upon and claims the benefit of priority from Japanese Patent Application No. 2019-042304, filed Mar. 8, 2019, the entire contents of which are incorporated herein by reference.

FIELD

Embodiments described herein relate generally to an image processing apparatus.

BACKGROUND

Recently, an image processing apparatus is generally known which includes an image signal processor (ISP) that performs image processing on image data captured by an on-vehicle camera. Since high reliability is required for the ISP which performs the image processing on the image data captured by an on-vehicle camera, it is necessary to perform normal diagnosis for determining whether or not the ISP fails.

In the related art, image data, which is output from a camera, is transmitted to the ISP through a single virtual channel (hereinafter, referred to as a VC). In a case of the single VC, the normal diagnosis is performed using a test pattern or a built-in self test (BIST) in a vertical blanking period (hereinafter, referred to as a V blank period) of the image data.

In contrast, an image processing apparatus is known which is configured to transmit a plurality of image data that are output from a plurality of cameras to the ISP after respectively assigning the plurality of image data to a plurality of VCs, and is configured to process the plurality of image data by the single ISP.

When the plurality of image data, which are output from the plurality of cameras, are transmitted to the ISP after the plurality of image data are respectively assigned to the plurality of VCs, V blank periods of the plurality of image data are separately input to the ISP. Therefore, there is a problem in that it is difficult to secure the V blank periods, and thus it is not possible to perform the normal diagnosis.

Examples of related art include JP-A-2018-191248.

DETAILED DESCRIPTION

At least one embodiment provides an image processing apparatus which is capable of performing normal diagnosis even in a case where a plurality of VCs are provided.

In general, according to at least one embodiment, there is provided an image processing apparatus including a plurality of transfer units, a data storage unit, an image processing processor, and a test circuit. A plurality of captured image data are respectively assigned to the plurality of transfer units and the plurality of transfer units transfer the assigned image data. The data storage unit stores the plurality of image data which are transferred by the plurality of transfer units. The image processing processor performs image processing on the plurality of image data which are stored in the data storage unit. The test circuit tests the image processing processor in a period during which the image data are not input from the data storage unit to the image processing processor.

Hereinafter, embodiments will be described in detail with reference to the accompanying drawings.

First Embodiment

First, a structure of an image processing apparatus according to a first embodiment will be described based on FIGS. 1 and 2.

Figure 1:
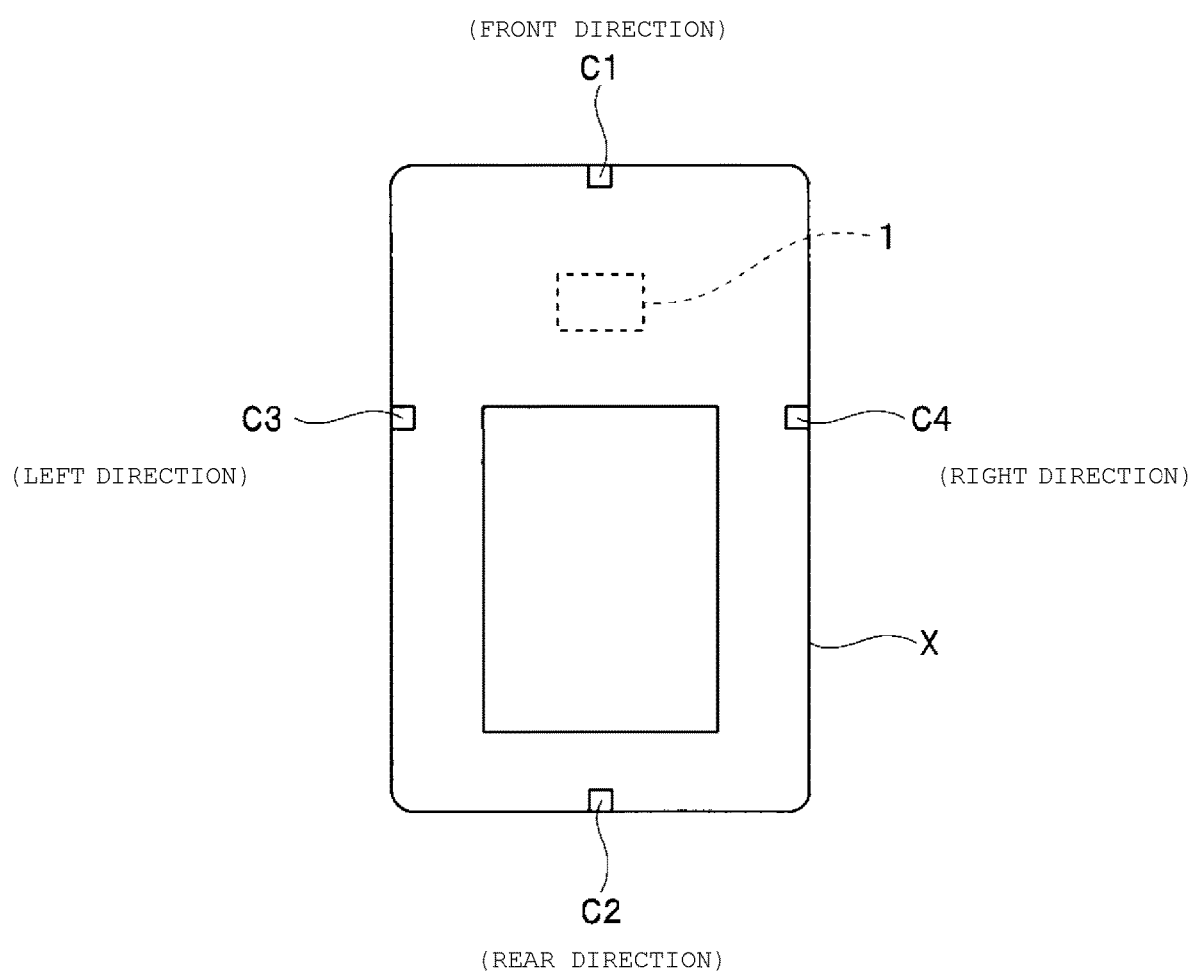
FIG. 1 is a diagram illustrating an example of a vehicle on which an image processing apparatus according to a first embodiment is mounted.
Figure 2:
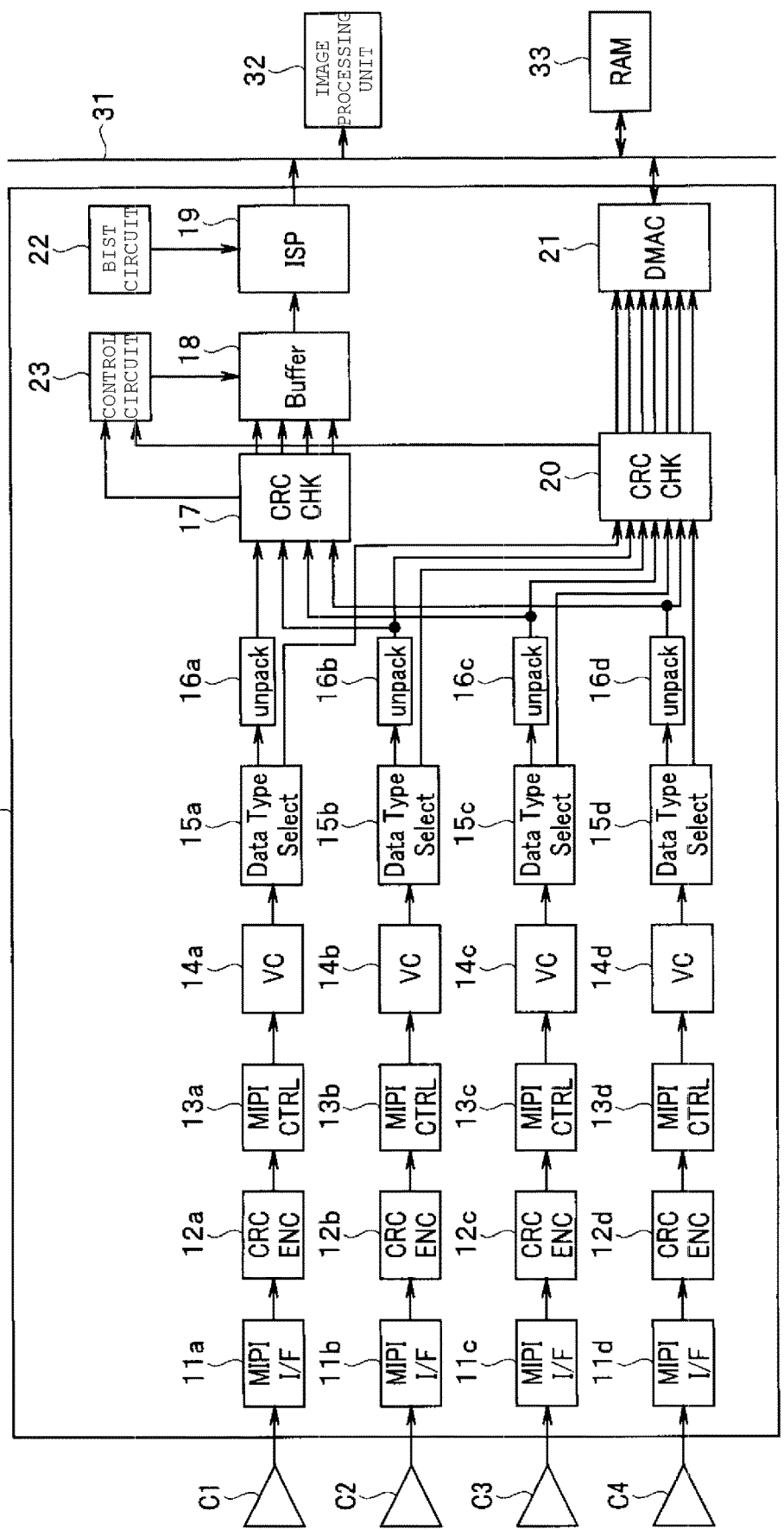
FIG. 2 is a block diagram illustrating a detailed structure of the image processing apparatus according to the first embodiment.

FIG. 1 is a diagram illustrating an example of a vehicle on which the image processing apparatus according to the first embodiment is mounted, and FIG. 2 is a block diagram illustrating a detailed at least one of the image processing apparatus according to the first embodiment.

As illustrated in FIG. 1, an image processing apparatus 1 is mounted on, for example, a vehicle X such as an automobile. In the vehicle X, four on-vehicle cameras C1, C2, C3, and C4 for capturing images around the vehicle X are mounted.

In the description below, in a case where a driver sits down on a driver's seat of the vehicle X, a front side is set to a front direction, a rear side is set to a rear direction, a left side is set to a left direction, and a right side is set to a right direction.

The camera C1 is attached to the front side of the vehicle X, and acquires image data in the front direction of the vehicle X. The camera C2 is attached to the rear side of the vehicle X, and acquires image data in the rear direction of the vehicle X. The camera C3 is attached to the left side of the vehicle X, and acquires image data in the left direction of the vehicle X. The camera C4 is attached to the right side of the vehicle X, and acquires image data in the right direction of the vehicle X. The image data, which are acquired by the cameras C1, C2, C3, and C4, are input to the image processing apparatus 1.

The image processing apparatus 1 may be a semiconductor apparatus for processing the image data which are acquired by the four cameras C1, C2, C3, and C4 that are mounted on the vehicle X.

As illustrated in FIG. 2, the image processing apparatus 1 includes MIPI I/Fs 11a to 11d, CRC ENCs 12a to 12d, MIPI CTRLs 13a to 13d, VCs 14a to 14d, Data Type Selects 15a to 15*d*, unpacks 16*a* to 16*d*, a CRC CHK 17, a buffer 18, an ISP 19, a CRC CHK 20, a DMAC 21, a BIST circuit 22, and a control circuit 23.

The MIPI I/Fs 11*a* to 11*d* receive imaging data (RAW data) which are captured by the cameras C1 to C4 that function as imaging units, and output the imaging data to the CRC ENCs 12*a* to 12*d*. The CRC ENCs 12*a* to 12*d*, which form an encoding unit (encoder), add, to the input RAW data, cyclic redundancy check (CRC) codes corresponding to one type of method for detecting an error generated during data transfer, and output the CRC code-added data to the MIPI CTRLs 13*a* to 13*d*. The CRC ENCs 12*a* to 12*d* add, for example, the CRC codes for respective lines.

In at least one embodiment, while the CRC codes are added to the input RAW data, the embodiment is not limited thereto. For example, the image processing apparatus 1 may include an error correcting code (ECC) circuit for adding ECC codes, which are capable of detecting the error generated during the data transfer and are capable of correcting the detected error, to the input RAW data. In this case, the ECC circuit adds the ECC codes for respective several pixel units.

The MIPI CTRLs 13*a* to 13*d* assign respective RAW data, which are input from the CRC ENCs 12*a* to 12*d*, to the VCs 14*a* to 14*d* which form a plurality of transfer units. The VCs 14*a* to 14*d* transfer the RAW data to the Data Type Selects 15*a* to 15*d*. Since the image processing apparatus 1 of at least one embodiment includes four physical channels, the image processing apparatus 1 may not include the VCs 14*a* to 14*d*.

The Data Type Selects 15*a* to 15*d* select data types (header information, image data, or the like) of the input RAW data, and output the data types to the unpacks 16*a* to 16*d* and the CRC CHK 20. The Data Type Selects 15*a* to 15*d* output the image data to the unpacks 16*a* to 16*d* and output pieces of header information to the CRC CHK 20.

The unpacks 16*a* to 16*d* decode the image data, which are input from the Data Type Selects 15*a* to 15*d*, and output the decoded image data to the CRC CHK 17. In addition, the unpacks 16*b* to 16*d* output the decoded image data to the CRC CHK 20. Specifically, the unpacks 16*a* to 16*d* perform data sorting with respect to the input image data, and output the image data, on which the data sorting is performed, to the CRC CHK 17 and the CRC CHK 20.

The CRC CHK 17, which forms a decoding unit (decoder), decodes the CRC codes, which are added to the image data that are input from the unpacks 16*a* to 16*d*, and checks whether or not an error exists in the image data. When the error is detected in the image data, the CRC CHK 17 outputs an error signal to, for example, the control circuit 23.

On a path of the MIPI CTRL 13*a*, the VC 14*a*, and the Data Type Select 15*a*, data is only selected and a data value is not changed. In addition, the unpack 16*a* only changes the order of the input image data, and the data value is not changed. Therefore, on a path from the MIPI CTRL 13*a* to the unpack 16*a*, the data value is not changed. A path from the MIPI CTRL 13*b* to the unpack 16*b*, a path from the MIPI CTRL 13*c* to the unpack 16*c*, and a path from the MIPI CTRL 13*d* to the unpack 16*d* are treated similarly, and data values are not changed. In the embodiment, on the paths, in which the data values are not changed, diagnosis of whether or not failures (errors) exist is performed using the CRC codes.

The buffer 18, which forms a data storage unit (data storage), is a line buffer which stores the image data corresponding to, for example, 100 or more lines, and stores the image data which are input from the unpacks 16*a* to 16*d*. The buffer 18 secures V blank periods by matching phases of the image data transferred by the VCs 14*a* to 14*d* under the control of the control circuit 23, and outputs the V blank periods to the ISP 19. Meanwhile, the control circuit 23 is capable of controlling not only the buffer 18 but also the respective circuits in the image processing apparatus 1.

As will be described later, in at least one embodiment, a BIST is performed in the V blank periods which are secured by matching the phases of the respective image data. Therefore, a configuration is made such that the phases of the respective image data, which are input by the buffer 18 that forms the line buffer, are matched. Meanwhile, in a case of a configuration in which the cameras C1, C2, C3, and C4 are controlled and the phases of the image data, which are output from the cameras C1, C2, C3, and C4, are matched, the image processing apparatus 1 may not include the buffer 18 for matching the phases of the respective image data.

The ISP 19 performs image processing on the input image data, converts the RAW data into RGB data, and outputs resulting data to the image processing unit 32 through a bus 31. The image processing unit 32 is capable of identifying a person, a mark, or the like by performing pattern matching or the like on the image data, which is converted into the RGB data by the ISP 19.

The CRC CHK 20, which forms the decoding unit, decodes the CRC codes, which are added to the image data that are input from the Data Type Selects 15*a* to 15*d*, and the CRC codes, which are added to the pieces of header information that are input from the unpacks 16*b* to 16*d*, and checks whether or not the errors exist on the data. When the errors are detected in the data, the CRC CHK 20 outputs an error signal to, for example, the control circuit 23.

The DMAC 21 is capable of outputting the image data and the pieces of header information to an external RAM 33 through the bus 31, and causing the RAM 33 to store the image data and the pieces of header information. Meanwhile, a configuration is made such that data on which processing is not performed in the ISP 19, the RGB data on which processing is performed in the ISP 19, YUV data, embedded data, and the like are input to the DMAC 21.

The BIST circuit 22, which forms a test circuit, performs the built-in self test (BIST) of the ISP 19 in the V blank periods secured by the buffer 18, and diagnoses whether or not failures exist in the ISP 19.

Subsequently, an operation of the image processing apparatus 1, which is configured as described above, will be described.

Figure 3:
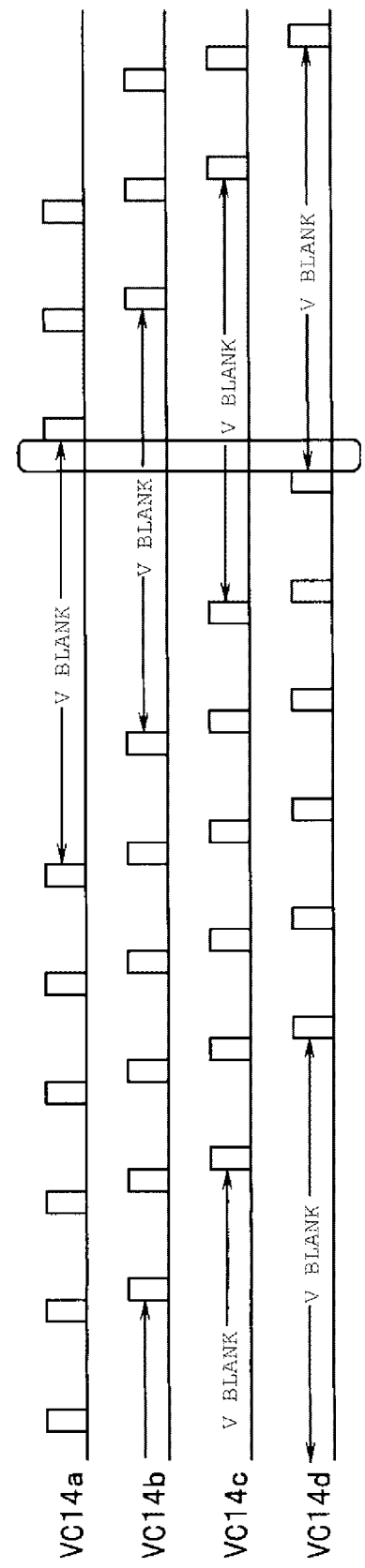
FIG. 3 is a timing chart illustrating an example of image data which is input to an ISP of a comparative example.
Figure 4:
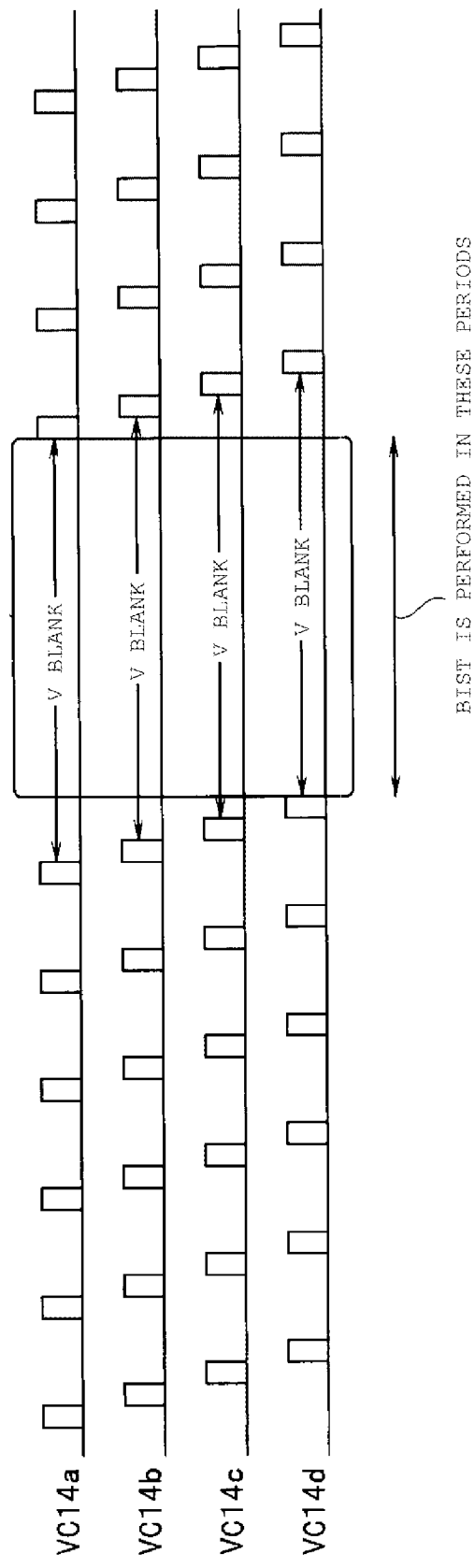
FIG. 4 is a timing chart illustrating an example of image data which is input to an ISP of the first embodiment.

FIG. 3 is a timing chart illustrating an example of image data which is input to an ISP of a comparative example, and FIG. 4 is a timing chart illustrating an example of the image data which is input to an ISP of the first embodiment.

Since high reliability is generally required for the ISP 19, which processes the image data from the on-vehicle cameras C1, C2, C3, and C4, it is necessary to perform the normal diagnosis by, for example, the BIST or the like.

In the comparative example, the image data, which are acquired by the cameras C1, C2, C3, and C4, are assigned to the VCs 14*a*, 14*b*, 14*c*, and 14*d*, and are input to the ISP 19. Therefore, in the comparative example, as illustrated in FIG. 3, the input to the ISP 19 is performed while the V blank periods are separated for the respective VCs 14*a*, 14*b*, 14*c*, and 14*d*.

In this case, it is not possible to secure the V blank periods in which the image data are not input from all the VCs 14*a* to 14*d*. Otherwise, even though it is possible to secure the V blank periods in which the image data are not input from all the VCs 14*a* to 14*d*, the V blank periods are extremely short periods, and thus it is not possible to perform the BIST.

In contrast, in at least one embodiment, the buffer 18 stores the image data from the VCs 14*a* to 14*d*. The buffer 18 outputs the image data from the VCs 14*a* to 14*d* to the ISP 19 after matching the phases of the image data from the VCs 14*a* to 14*d* under the control of the control circuit 23.

As a result, as illustrated in FIG. 4, it is possible to secure the V blank periods in which the image data are not input from all the VCs 14*a* to 14*d*. The BIST circuit 22 performs the BIST of the ISP 19 in the V blank periods in which the image data are not input from all the VCs 14*a* to 14*d*.

As above, the image data from the VCs 14*a* to 14*d* are temporally stored in the buffer 18 and are output to the ISP 19 after the phases are matched. Therefore, it is possible for the ISP 19 to secure the V blank periods of the image data from the VCs 14*a* to 14*d*. It is possible for the BIST circuit 22 to detect whether or not an abnormality exists by performing the BIST in the secured V blank periods.

Accordingly, according to the image processing apparatus of at least one embodiment, it is possible to perform the normal diagnosis even through a plurality of VCs are provided.

In addition, for parts (the path from the MIPI CTRL 13*a* to the unpack 16*a*, the path from the MIPI CTRL 13*b* to the unpack 16*b*, the path from the MIPI CTRL 13*c* to the unpack 16*c*, and the path from the MIPI CTRL 13*d* to the unpack 16*d*) at which it is not possible to secure the V blank periods, the CRC codes are added to entrances of the data, and the CRC codes are checked at exists of the data, and thus it is checked that the data is not changed.

As a result, it is possible for the image processing apparatus 1 to detect that the abnormality does not exist on the path from the MIPI CTRL 13*a* to the unpack 16*a*, the path from the MIPI CTRL 13*b* to the unpack 16*b*, the path from the MIPI CTRL 13*c* to the unpack 16*c*, and the path from the MIPI CTRL 13*d* to the unpack 16*d*.

First Modified Example

Subsequently, a first modified example of the first embodiment will be described.

While the image processing apparatus, in which the image data are input from the four cameras C1 to C4, is described in the first embodiment, the number of cameras is not limited to four. For example, the number of cameras may be one, two, three, or five or more. In the first modified example, an image processing apparatus, in which the image data is input from one camera (here, the camera C1), will be described.

Figure 5:
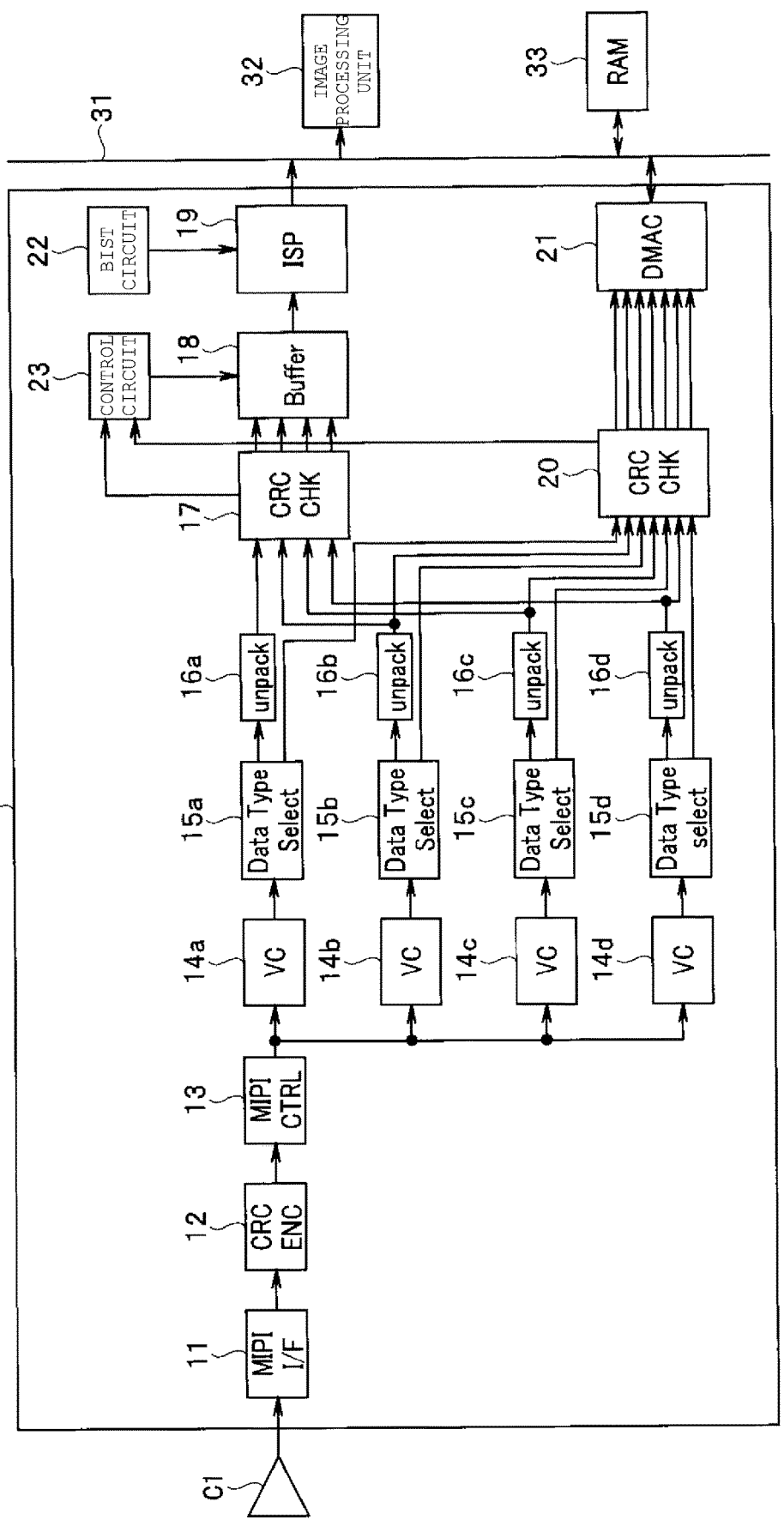
FIG. 5 is a block diagram illustrating a detailed structure of an image processing apparatus according to a first modified example.

FIG. 5 is a block diagram illustrating a detailed structure of the image processing apparatus according to the first modified example. Meanwhile, in FIG. 5, the same reference symbols are attached to the same configurations as in FIG. 2, and the description thereof will not be repeated.

The image data, which is captured by the camera C1, is input to an image processing apparatus 1A of the first modified example. The camera C1 is a sensor corresponding to a high dynamic range (HDR), captures one image a plurality of times while changing luminance (brightness), and outputs a plurality of image data in which the luminance is changed. That is, the plurality of image data are acquired by changing the luminance for one image which is captured by one camera C1.

The image processing apparatus 1A includes an MIPI I/F 11, a CRC ENC 12, and an MIPI CTRL 13 instead of the MIPI I/Fs 11*a* to 11*d*, the CRC ENCs 12*a* to 12*d*, and the MIPI CTRLs 13*a* to 13*d* of FIG. 2. Four image data, which are captured by the camera C1 while the luminance is changed, are transmitted to the MIPI I/F 11.

The MIPI I/F 11 receives the four image data which are captured by the camera C1, and outputs the four image data to the CRC ENC 12. The CRC ENC 12 adds the CRC codes corresponding to one type of the method for detecting the error generated during data transfer to the input four image data, and outputs resulting data to the MIPI CTRL 13.

The MIPI CTRL 13 assigns the four input image data to the VCs 14*a* to 14*d*, respectively. The MIPI CTRL 13 assigns the four input image data to the VCs 14*a* to 14*d*, respectively, by analyzing pieces of header information which are added to the four image data.

Other configurations and operations are the same as in the first embodiment. It is possible for the image processing unit 32 to perform HDR composition on four images which are captured while the luminance is changed, and to generate a single image.

In the first modified example, output to the ISP 19 is performed after the phases of the plurality of image data of different luminance are matched in the buffer 18. As a result, it is possible for the image processing apparatus 1A to secure the V blank periods in which the image data are not input from the VCs 14*a* to 14*d*. The BIST circuit 22 performs the built-in self test (BIST) of the ISP 19 on the V blank periods in which the image data are not input from all the VCs 14*a* to 14*d*.

Therefore, according to the image processing apparatus of the first modified example, it is possible to perform the normal diagnosis on the V blank periods even though the plurality of VCs are provided similar to the first embodiment.

Second Modified Example

Subsequently, a second modified example of the first embodiment will be described.

In the first embodiment, since the phases of the plurality of image data are output after being matched in the buffer 18, there is a problem in that capacity of the buffer 18 becomes large capacity. Here, in the second modified example, an image processing apparatus, in which it is possible to reduce the capacity of the buffer 18, will be described.

Figure 6:
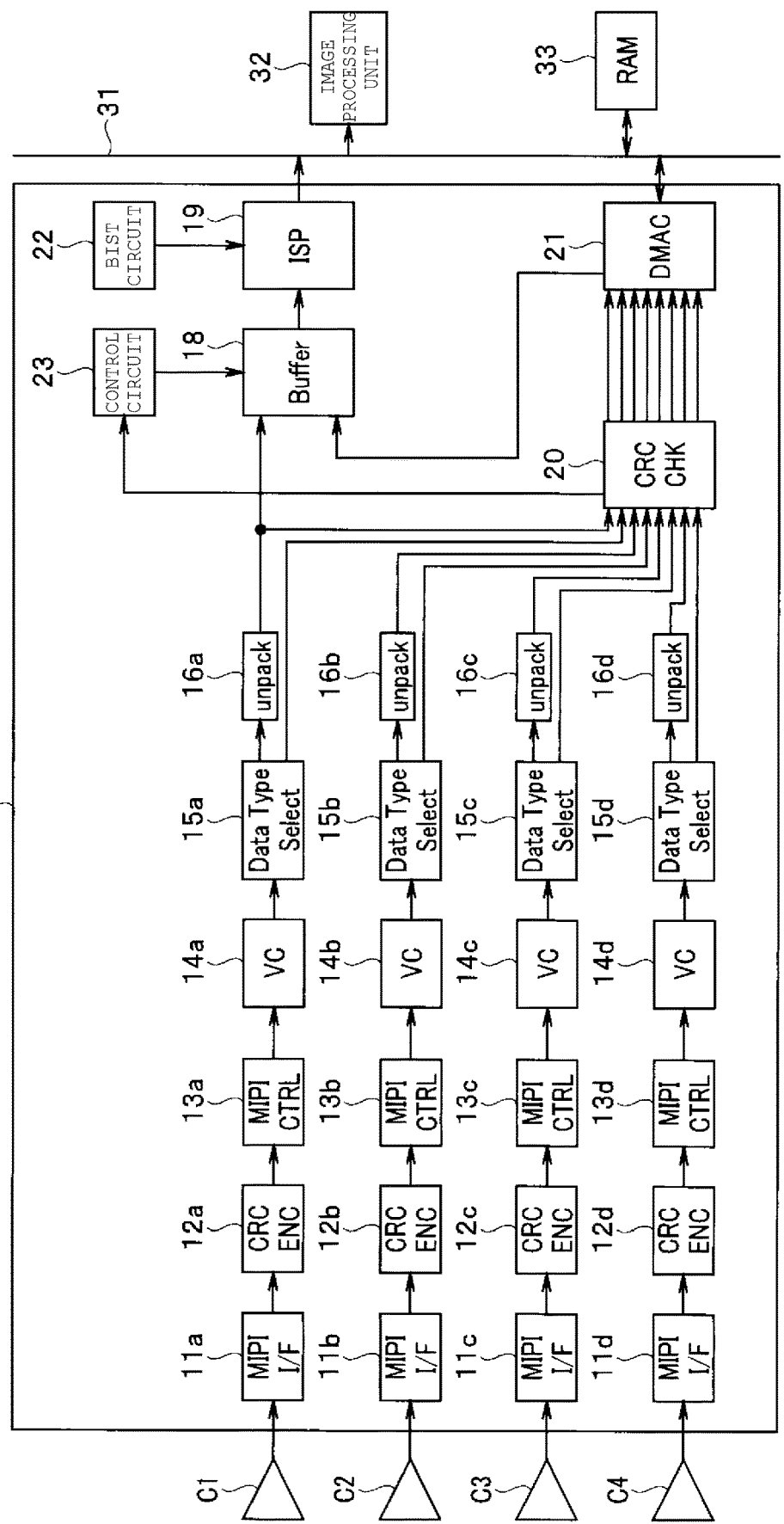
FIG. 6 is a block diagram illustrating a detailed structure of an image processing apparatus according to a second modified example.

FIG. 6 is a block diagram illustrating a detailed configuration of an image processing apparatus according to the second modified example. In FIG. 6, the same reference symbols are attached to the same configurations as in FIG. 2, and the description thereof will not be repeated.

An image processing apparatus 1B includes a buffer 18*a* instead of the buffer 18 of FIG. 2. The buffer 18*a* is a line buffer which stores image data corresponding to only a few lines.

The image data from the Data Type Selects 15*a* to 15*d* and the unpacks 16*a* to 16*d* are input to the CRC CHK 20. The CRC CHK 20 decodes the CRC codes which are added to the image data that are input from the Data Type Selects 15*a* to 15*d* and the unpacks 16*a* to 16*d*, and checks whether or not errors exist in the image data. When the errors are detected in the data, the CRC CHK 20 outputs an error signal to, for example, the control circuit 23.

The DMAC 21 outputs the image data to the external RAM 33 through the bus 31. The RAM 33 forms a buffer which stores the image data. The DMAC 21 reads the image data after matching the phases of the image data which are stored in the RAM 33, and outputs the image data to the buffer 18*a*. The buffer 18*a* outputs the image data to the ISP 19 after temporally storing the image data from the DMAC 21. Other configurations and operations are the same as in the first embodiment.

As above, in a case where the external RAM 33 is formed as the buffer which stores the image data and matches the phases, it is possible to form the buffer 18a as the line buffer which stores the image data corresponding to only a few lines. Therefore, it is possible to reduce capacity of the buffer 18a of the second modified example to be smaller than that of the buffer 18 of the first embodiment.

That is, while the buffer 18 of the first embodiment is formed as the line buffer corresponding to 100 lines or more, it is possible to form the buffer 18a of the second modified example as the line buffer corresponding to a few lines. Therefore, it is possible to reduce the capacity of the buffer 18a of the second modified example to be small, compared to the buffer 18 of the first embodiment.

As a result, it is possible to reduce a circuit size of the image processing apparatus 1B of the second modified example to be small, compared to the image processing apparatus 1 of the first embodiment.

Second Embodiment

Subsequently, a second embodiment will be described.

Figure 7:
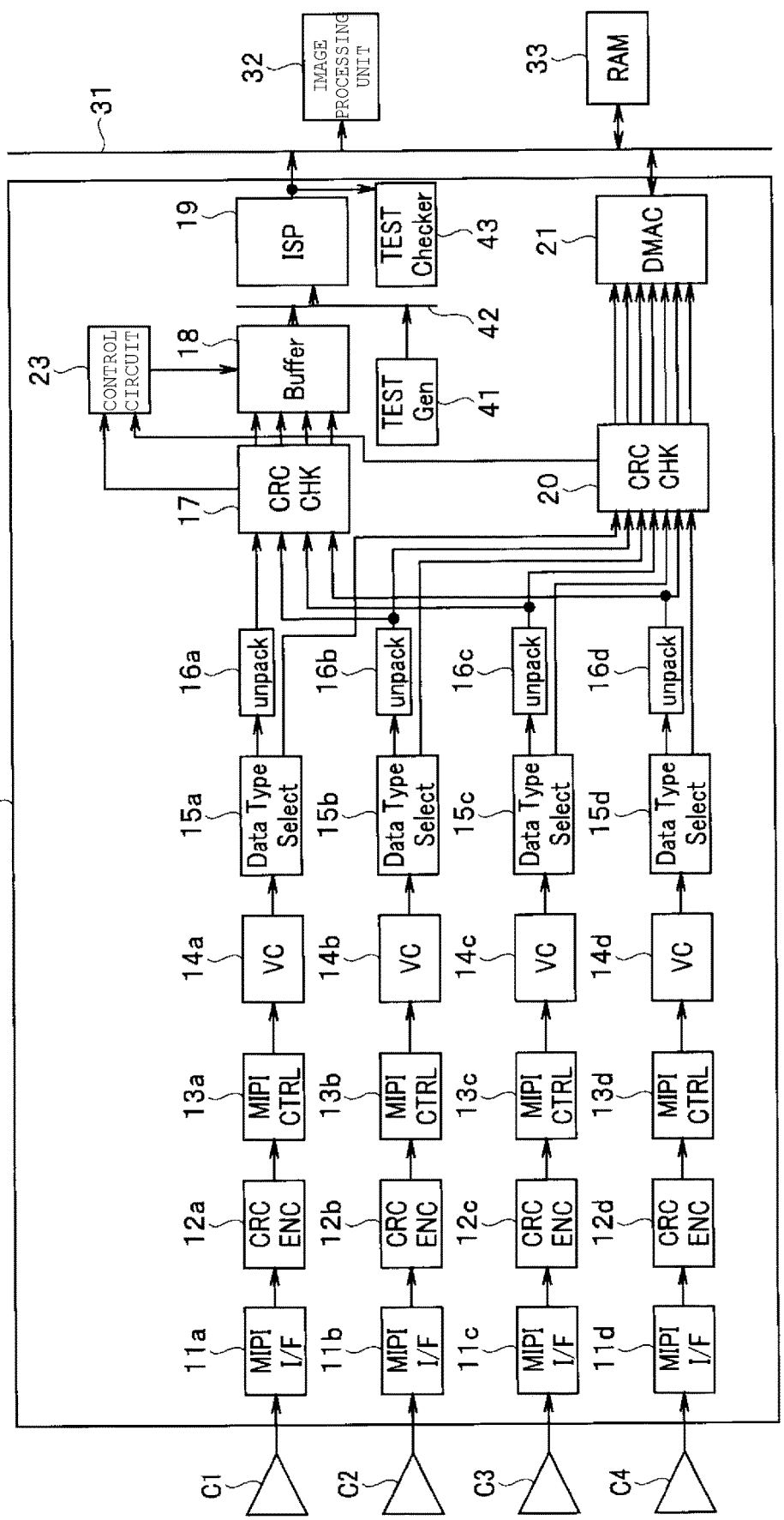
FIG. 7 is a block diagram illustrating a detailed structure of an image processing apparatus according to a second embodiment.

FIG. 7 is a block diagram illustrating a detailed structure of an image processing apparatus according to the second embodiment. In FIG. 7, the same reference symbols are attached to the same configurations as in FIGS. 2 and 6, and the description thereof will not be repeated.

As illustrated in FIG. 7, in an image processing apparatus 1C, the BIST circuit 22 is removed from the image processing apparatus 1 of FIG. 2, and a TEST Gen 41, a bus 42, and a TEST Checker 43 are added as a test circuit. In addition, the image processing apparatus 1C includes a buffer 18a instead of the buffer 18 of FIG. 2. Similar to the above-described second modified example of the first embodiment, the buffer 18a is a line buffer which stores image data corresponding to only a few lines.

The TEST Gen 41, which forms a test pattern generation circuit, generates a test pattern for testing the ISP 19, and inputs the generated test pattern to the ISP 19 through the bus 42. The TEST Gen 41 inputs the test pattern to the ISP 19 in a period during which the image data is not input from the buffer 18a to the ISP 19. The TEST Checker 43 compares data, which is output from the ISP 19, with an expected value, and diagnoses whether or not failures exist in the ISP 19. Other configurations are the same as in the first embodiment.

Figure 8:
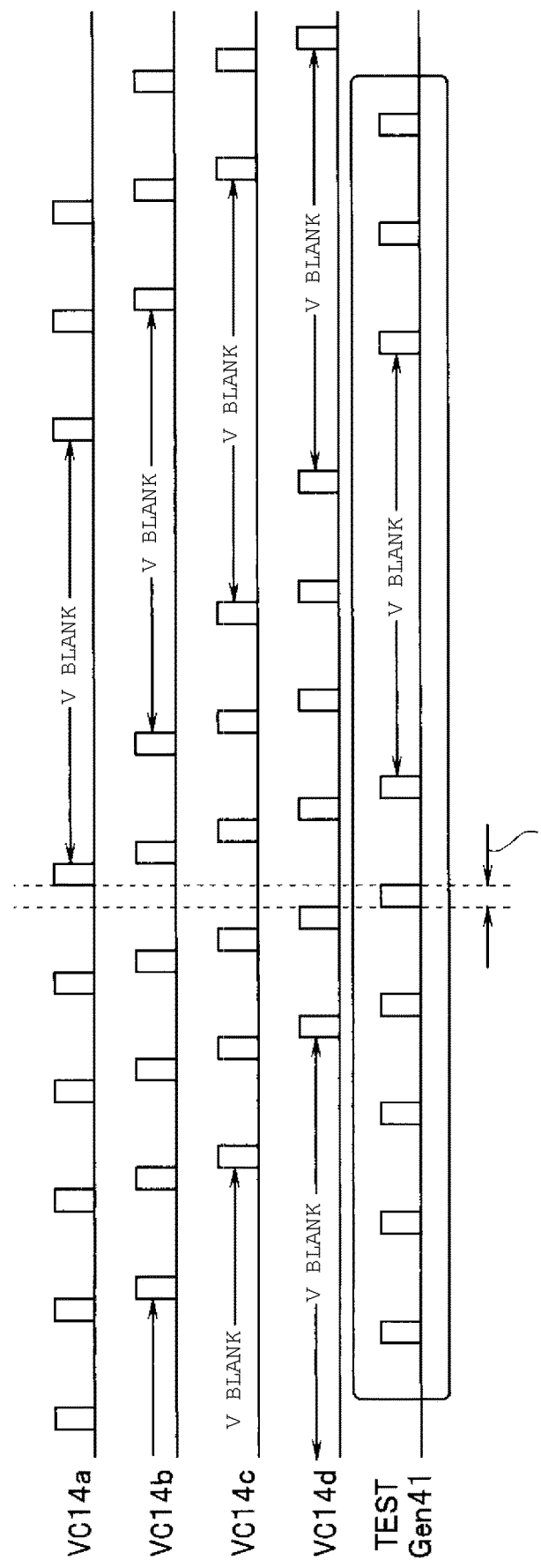
FIG. 8 is a timing chart illustrating an example of image data and a test pattern, which are input to an ISP of the second embodiment.

FIG. 8 is a timing chart illustrating an example of the image data and a test pattern, which are input to the ISP of the second embodiment.

The test pattern is input from the TEST Gen 41 to the ISP 19 in a period during which the image data are not input from the VCs 14a to 14d. The TEST Checker 43 compares the data, which is output from the ISP 19, with the expected value, and diagnoses whether or not failures occur in the ISP 19.

In at least one embodiment, since it is not necessary to secure the V blank periods after matching the phases of the image data from the VCs 14a to 14d, capacity of the buffer 18a may be small capacity, similar to the above-described second modified example of the first embodiment.

As above, it is possible for the image processing apparatus 1C of at least one embodiment to perform the normal diagnosis even though a plurality of VCs are provided, similar to the first embodiment.

Furthermore, in the image processing apparatus 1C of at least one embodiment, it is not necessary to match the phases of the image data from the VCs 14a to 14d, and thus it is possible to reduce the capacity of the buffer 18a to be smaller than the capacity of the buffer 18 of the first embodiment. As a result, in the image processing apparatus 1C of the present embodiment, it is possible to reduce the circuit size to be smaller than that of the image processing apparatus 1 of the first embodiment.

Meanwhile, in the second embodiment, the number of cameras is not limited to four and, for example, the number of cameras may be one, two, three, or five or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An image processing apparatus comprising:
a plurality of transfer units to which a plurality of image data are respectively assigned and configured to transfer the assigned image data, wherein the plurality of image data are set to a plurality of image data by changing luminance for one image which is captured by one camera;
a data storage that stores the plurality of image data which are transferred by the plurality of transfer units;
an image processing processor configured to perform image processing on the plurality of image data which are stored in the data storage;
a test circuit configured to test the image processing processor in a period during which the image data are not input from the data storage to the image processing processor; and
a control circuit configured to perform control such that the plurality of image data, which are stored in the data storage, are output after phases of the plurality of image data of different luminance are matched.

2. The image processing apparatus according to claim 1, wherein the test circuit is a built-in self test (BIST) circuit configured to perform a built-in self test of the image processing processor in vertical blanking periods of the plurality of image data of which the phases are matched.

3. The image processing apparatus according to claim 2, further comprising:
an encoder configured to add an error correction code to the plurality of image data; and
a decoder configured to decode the error correction code which is added to the plurality of image data.

4. The image processing apparatus according to claim 2, wherein the image processing processor is configured to perform the image processing on the plurality of image data, and to convert RAW data into RGB data.

5. The image processing apparatus according to claim 1, wherein the test circuit is a test pattern generation circuit configured to generate a test pattern for testing the image processing processor, and to input the test pattern to the image processing processor in the period during which the image data are not input.

6. The image processing apparatus according to claim 5, further comprising:
an encoder configured to add an error correction code to the plurality of image data; and
a decoder configured to decode the error correction code which is added to the plurality of image data.

7. The image processing apparatus according to claim 5, wherein the image processing processor is configured to perform the image processing on the plurality of image data, and to convert RAW data into RGB data.

8. The image processing apparatus according to claim 1, further comprising:
an encoder configured to add an error correction code to the plurality of image data; and
a decoder configured to decode the error correction code which is added to the plurality of image data.

9. The image processing apparatus according to claim 8, wherein the error correction code is a CRC code for detecting an error that is generated during data transfer or an ECC code which detects the error generated during the data transfer and is capable of correcting the detected error.

10. The image processing apparatus according to claim 9, wherein the encoder is configured to add the CRC code for respective lines of the plurality of image data or to add the ECC code for respective several pixel units.

11. The image processing apparatus according to claim 8, wherein the image processing processor is configured to perform the image processing on the plurality of image data, and to convert RAW data into RGB data.

12. The image processing apparatus according to claim 1, wherein the image processing processor is configured to perform the image processing on the plurality of image data, and to convert RAW data into RGB data.

13. An image processing method comprising:
capturing, by one camera, one image and generating a plurality of image data by changing luminance for the one image;
transferring the plurality of image data;
storing, via a data storage, the plurality of image data which are transferred;
performing, via an image processing processor, image processing on the plurality of image data which are stored; and
testing the image processing processor in a period during which the image data are not input from the data storage to the image processing processor; and
performing control such that the plurality of image data, which are stored in the data storage, are output after phases of the plurality of image data of different luminance are matched.

* * * * *